United States Patent [19]
Miller

[11] Patent Number: 5,821,889
[45] Date of Patent: Oct. 13, 1998

[54] AUTOMATIC CLIP LEVEL ADJUSTMENT FOR DIGITAL PROCESSING

[75] Inventor: Gary L. Miller, Gainesville, Fla.

[73] Assignee: Sabine, Inc., Alachua, Fla.

[21] Appl. No.: 743,900

[22] Filed: Nov. 6, 1996

[51] Int. Cl.⁶ ................................................. H03M 1/18
[52] U.S. Cl. .......................................... 341/139; 381/102
[58] Field of Search .................................. 341/139, 144, 341/118; 381/94, 102

[56] References Cited

U.S. PATENT DOCUMENTS

| | | | |
|---|---|---|---|
| 4,219,880 | 8/1980 | Nichols | 364/718 |
| 4,355,304 | 10/1982 | Kasuga et al. | 340/347 |
| 4,373,189 | 2/1983 | Weant | 364/602 |
| 4,393,369 | 7/1983 | Davies | 341/139 |
| 5,075,687 | 12/1991 | Chen et al. | 341/110 |
| 5,245,665 | 9/1993 | Lewis et al. | 381/71 |
| 5,451,948 | 9/1995 | Jekel | 341/139 |
| 5,506,910 | 4/1996 | Miller et al. | 381/103 |
| 5,541,600 | 7/1996 | Blumenkrantz et al. | 341/139 |

Primary Examiner—Marc S. Hoff
Assistant Examiner—Peguy JeanPierre
Attorney, Agent, or Firm—Donald W. Marks

[57] ABSTRACT

The magnitude of analog audio input signal to an analog to digital converter in a digital audio processing system is increased or decreased in response to the magnitude of a sample of the digitized audio signal being found below or above, respectively, an acceptable range of magnitudes of the analog audio input signal. The magnitude of an audio output signal is correspondingly decreased or increased, after a delay equal to the processing delay. Additionally the increase of the magnitude of the audio input signal is delayed by a predetermined period, e.g., five to thirty seconds, during which the magnitude of the audio input signal remains below the acceptable input magnitude range.

15 Claims, 5 Drawing Sheets

AUTOMATIC CLIP LEVEL ADJUSTMENT FOR DIGITAL PROCESSING

TECHNICAL FIELD

The present invention relates to adjustment of analog input magnitudes applied to analog to digital converters in digital audio signal processing systems to avoid clipping of the input signal and to maintain a viable range of operation.

BACKGROUND ART

Analog to digital converters clip input signals which have magnitudes exceeding the upper input limit of the analog to digital converter. For example an analog to digital converter with a five volt input range will clip input signals greater than five volts. This introduces distortion in the digitized signal and analog signals reconstructed from the digital signal. Additionally, relatively small magnitude signals are converted into relatively low resolution digital signals which are often not properly processed. Furthermore, the dynamic range of signal magnitudes properly processed by digital processing is limited by the limited resolution of analog to digital converters, digital signal processors, digital to analog converters, and other digital processing circuits.

In one prior art audio processing technique, variable gain analog input and output devices are manually controlled by respective ganged potentiometers so that the analog input signal magnitude and the analog output signal magnitude can be simultaneously increased and decreased, respectively, or simultaneously decreased and increased, respectively, to maintain unity gain between the analog input and the analog output. While the manual control of the "Clip Level Adjustment" (dual potentiometer) works quite well in many applications, such manual control has no capability to automatically accommodate those occasions in which the signal magnitude rises above the manually set limits of the analog to digital converter. Further, such manual control, while providing for shifting of the dynamic range of digital processing cannot provide for expansion of the dynamic range.

An automatic prior art clip level adjustment system has been suggested using an automatic ranging input. The magnitude of the analog input is detected and used to automatically control the selection of one of four input amplification ranges of a variable ranging input amplifier. Bits identifying the amplification range are appended to the digitized signal and used to correspondingly control a variable ranging output divider. Conventional digital audio processing systems and algorithms are unable to process digital signals with appended range bits.

SUMMARY OF INVENTION

The invention is summarized in an apparatus and method of automatic clip level adjustment for audio signal processing wherein signal magnitudes are determined in successive samples of a digital audio signal from an analog to digital converter and compared to upper and lower limits of an acceptable range of audio input signal magnitude. If a determined signal magnitude is found greater than the upper limit of the acceptable audio signal magnitude range, the magnitude or gain of the audio input signal is automatically reduced and the magnitude or gain of the analog output signal from a digital to analog converter is correspondingly increased. If a plurality of successive determined signal magnitudes are found less than the lower limit of the acceptable audio signal magnitude range, the magnitude or gain of the audio input signal is automatically increased and the magnitude or gain of the analog output signal from a digital to analog converter is correspondingly reduced.

An object of the invention is to provide an apparatus and method for automatically adjusting the clip level in a digital audio processing system.

Another object of the invention is to expand the dynamic rang of audio signal magnitudes which can be processed by conventional digital processing circuits.

One advantage of the invention is that distortion in processing of audio signals is reduced by automatic adjustment of the clip level.

Additional features of the invention include the provision of a predetermined delay before increasing the magnitude of the audio input signal in response to a low input signal magnitude to avoid clip level adjustments during program pauses and temporary low signal levels; and the provision of a delay equal to a digital processing delay between the reduction or increase in the input audio signal magnitude and the corresponding increase or reduction in the output audio signal magnitude.

Other objects, advantages and features of the invention will be apparent from the following description of the preferred embodiments and the accompanying drawings.

DESCRIPTION OF THE PREFERRED EMBODIMENTS

Figure 1:
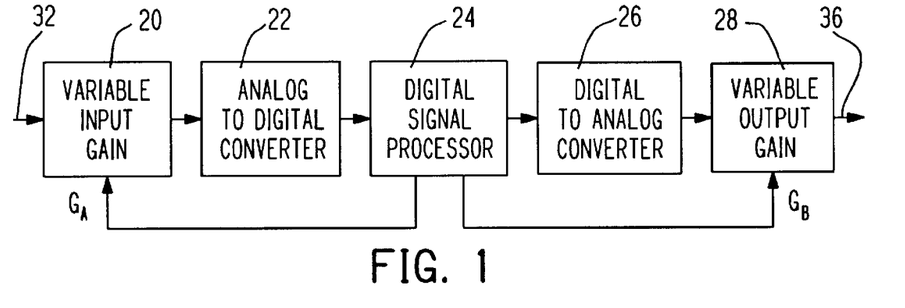
FIG. 1 is a block diagram of an audio signal processing system with automatic clip level adjustment in accordance with the apparatus and method of the invention.
Figure 2:
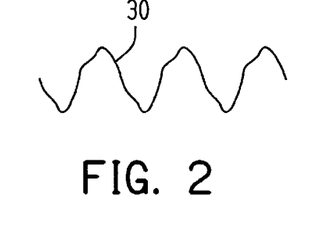
FIG. 2 is a waveform illustrating an example of an analog audio input signal in the system of FIG. 1.
Figure 3:
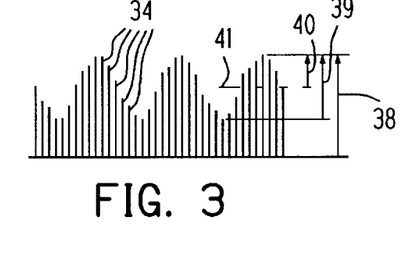
FIG. 3 is an illustration of a series of digitized audio signal values forming a digital sample in the system of FIG. 1.

As shown in FIG. 1, a digital processing system in accordance with one embodiment of the invention includes a variable input gain device 20, an analog to digital (A-D) converter 22, a digital signal processor 24, a digital to analog (D-A) converter 26, and a variable output gain device 28. An analog audio input signal, such as signal 30 illustrated in FIG. 2 from a microphone (not shown), musical instrument (not shown), mixer (not shown), or other audio program source (not shown), is applied to the input 32 of the variable input gain device 20 which, in turn, applies the analog input signal to the input of the analog to digital converter 22. The digital audio signal produced by the analog to digital converter 22, such as the series of digital values 34 shown in FIG. 3, is applied to the digital signal processor 24 wherein the digital audio signal is processed and then applied to the digital to analog converter 26 which in turn produces an analog audio output signal applied to the variable output gain device 28. The output 36 of the variable output gain device 28 is the output of the digital processing system which can then be applied to a power amplifier system (not shown) driving one or more speakers (not shown). The gain $G_A$ of the variable input gain device 20 and the gain $G_B$ of the variable output gain device 28 are controlled by the digital signal processor 24 to automatically adjust the clip level of the analog to digital converter 22 while maintaining a constant gain, such as unity, or a predetermined variable gain between the input 32 and the output 36.

Figure 4:
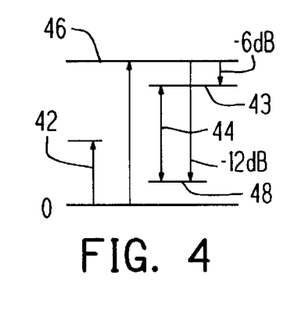
FIG. 4 is a diagram illustrating relative signal magnitudes and magnitude ranges in the system of FIG. 1.

In automatic adjustment of the clip level, the digital signal processor 24 determines magnitudes of successive digital audio signal samples, such as digital magnitude 38, peak to peak magnitude 39, magnitude 40 above A-D offset 41, or other digital sample magnitude representing the magnitude of the audio signal. Each determined digital audio sample magnitude can simply be each successive digital value 34 read from the analog to digital converter 22 or can be a calculated value determined from one or more of the successive digital values 34 read from the analog to digital converter 22. Each determined digital audio sample magnitude, represented by sample magnitude 42 in FIG. 4, is compared with the upper limit 43 of an acceptable range of input signal magnitudes 44. This upper limit 43 is a predetermined value, for example, –6 dB below the maximum signal level 46 of the analog to digital converter 22 in a system using an analog to digital converter with ±5 volt input and 20 bit resolution. If the sample magnitude 42 is found to be greater than the upper limit 43, then the input gain $G_A$ is reduced by an increment such as –0.5 dB, and after a delay equal to the digital processing delay, the output gain $G_B$ is correspondingly increased by a corresponding increment such as +0.5 dB in case of system unity gain.

If the sample magnitude 42 is not above the upper limit 43, the sample magnitude is compared with the lower limit 48. This lower limit 48 is a predetermined value above the zero input signal level, for example, –12 dB below the maximum or clip level 46 of a ±5 volt analog to digital converter 22 with 20 bit resolution. When a plurality of successive digital audio signal samples 42, such as the samples in a predetermined time period generally in the range from five to thirty seconds or preferably in the range from thirteen to fifteen seconds, are found to be less than the lower limit 48 then the gain $G_A$ of the variable input device 20 is increased by an increment such as +0.5 dB, and after a delay equal to the digital processing delay, the output gain $G_B$ is correspondingly reduced by a corresponding increment such as –0.5 dB in the case of system unity gain.

Figure 5:
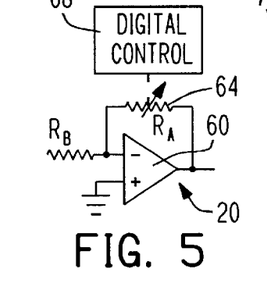
FIG. 5 is an electrical diagram of a variable gain input device in the system of FIG. 1.
Figure 6:
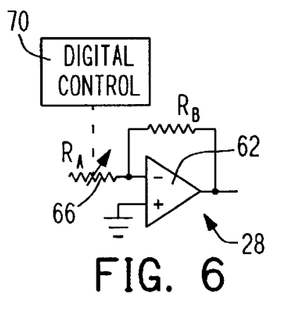
FIG. 6 is an electrical diagram of a variable gain output device in the system of FIG. 1.

The variable input gain device 20 and the variable output gain device 28 can be any variable amplification and/or attenuation devices which can be controlled by signals from the digital processor 24. In one example illustrated in FIGS. 5 and 6, the devices 20 and 28 are respective operational amplifiers 60 and 62 with respective feedback and input resistances 64 and 66 controlled by digital controls 68 and 70 to produce corresponding variable positive and negative gains $R_A/R_B$ and $R_B/R_A$. As described herein, a positive gain is a gain greater than one while a negative gain is a gain less than one. The digitally controlled resistances can be motor controlled potentiometers, solid state switched resistances, or other controlled resistances. Alternatively, many other types of digitally controlled or voltage controlled variable amplifiers and/or attenuators can be used. Furthermore the combined gain of the variable input device 20 and the variable output device 28 in the processing system is not limited to unity but may also be any constant positive or negative gain or may be variable or non-linear such as in accordance with a magnitude compression or expansion algorithm; adjustments are made in the output gain corresponding to changes in the input gain to avoid introducing signal distortion by the adjustment of the clip level of the processing system.

The analog to digital converter 22 and the digital to analog converter 26 have been described above as having, for example, ±5 volt analog ranges and 20 bit digital resolution. However various other analog to digital converters and digital to analog converters can be suitably employed in digital processing of audio signals with the voltage ranges and resolution being selected for system quality, cost and/or other factors. Additionally the analog to digital converter 22 and the digital to analog converter 26 can incorporate the respective variable input gain device 20 and variable output gain device 28 in respective A-D and D-A integrated circuit units. Still further the digital signal processor 24 may be an integrated circuit unit with the analog to digital converter 22 and digital to analog converter 28 incorporated therein.

Figure 7:
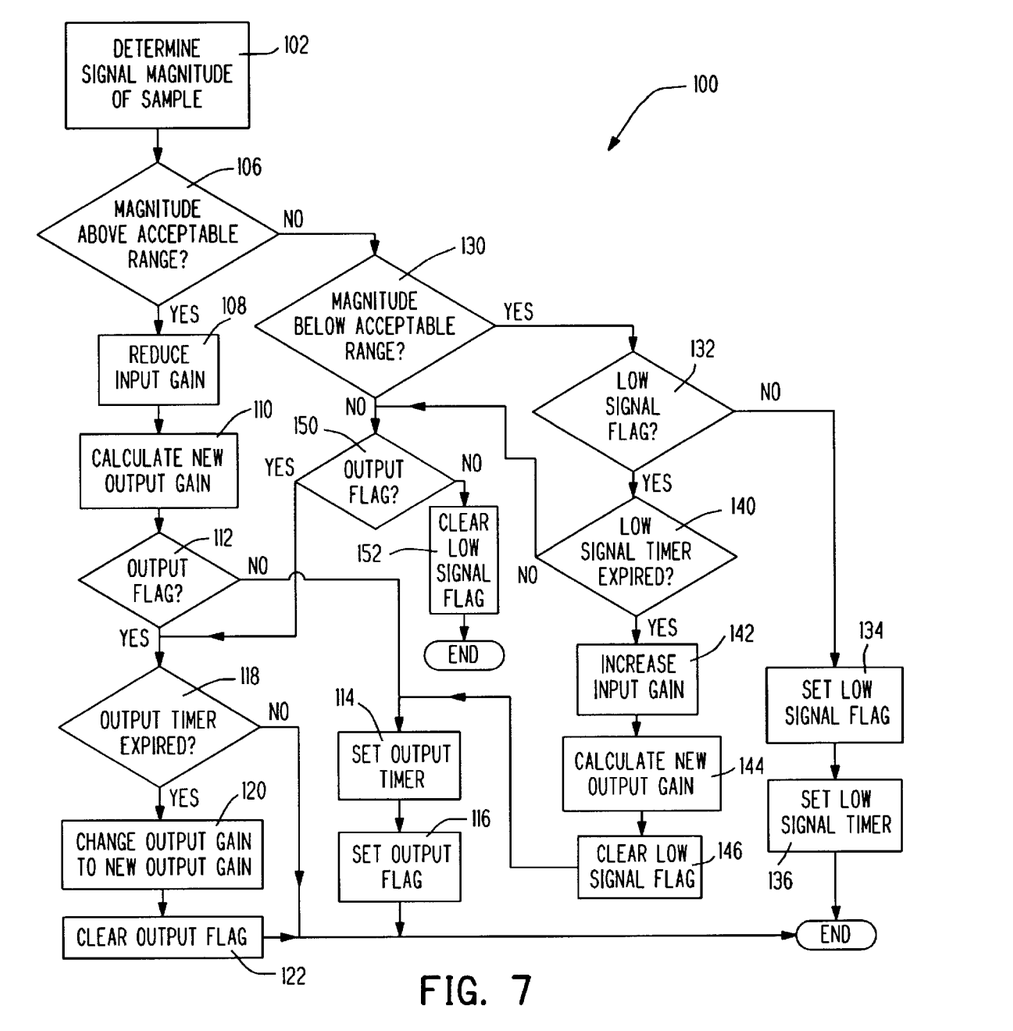
FIG. 7 is a program flow chart of an automatic gain control procedure in the system of FIG. 1.

The digital signal processor 24 is a conventional digital signal processor which contains an automatic gain control program or procedure such as the procedure 100 illustrated in FIG. 7 in addition to a conventional digital audio signal processing program. In the first step 102, the magnitude of a sample of the digital audio signal in a is determined. In simplest form, each sample magnitude is a digital value periodically read from the analog to digital converter 22, such as each successive digital value 34 (FIG. 3) or one out of every n (where n is an integer greater than one) successive digital values. In a more complex form, each sample magnitude can be a calculated value such as the absolute difference 40 between the offset 41 of the analog to digital converter 22 and each digital value 34 or every nth digital value read from the analog to digital converter 22. In a still more complex form, each sample magnitude can be an average value or some other calculated value of each successive group of two or more digital values read from the analog to digital converter 22. Furthermore, each sample magnitude can be a peak to peak value such as peak to peak value 39 (FIG. 3) or two times the maximum magnitude 40 determined from a series of a predetermined number (for example 4096) digital readings read from the analog to digital converter 22.

The sample magnitude 42, FIG. 4, determined in step 102 is then compared in step 106 with the upper limit 43 of the acceptable range 44 of input signal magnitudes to the analog to digital converter 22. This acceptable range 44 is smaller than the maximum input voltage range of the analog to digital converter 22, for example from –12 dB to –6 dB of the maximum A-D input voltage range (for a ten volt maximum input voltage range from 2.5 to 5.0 volts). If the sample magnitude 42 is found in step 106 to be greater than the upper limit 43 of the acceptable range 44, then in step 108 the input gain is incrementally reduced, for example by 0.5 dB (i.e. about 5.6%).

In step 110, a new output gain is calculated and stored but not yet applied to the variable gain output device 28. Where the system gain is unity and the input gain is reduced by relatively small increments such as 0.5 dB increments, the new output gain would be increased by the same small increments such as 0.5 dB. Thus the output gain can be calculated by the formula $$G_B = \frac{1}{G_A}$$

where $G_B$ is the output gain and $G_A$ is the input gain. The system can be designed with a constant positive or negative gain; in this case the output gain $G_B$ can be calculated by a formula:

$$G_B = a \cdot \frac{1}{G_A}$$

where a is the constant system gain; or the output gain is increased by an increment such as a 0.5a dB. The output gain can also be a variable gain such as a gain designed to produce magnitude compression for example by a formula:

$$G_B = b + \frac{1}{c \cdot G_A}$$

where b is minimum output gain and c is a factor controlling the dynamic range of the output gain above the minimum gain; such compression is used to maintain minimum audio output signal levels, such as in voice signals, to ensure that the compressed audio signals can be easily heard. Many other algorithms providing non-linear, logarithmic, or other changes in output gains relative to changes in input gains can be used in step 110.

In the next step 112 it is determined whether there is an output flag indicating the running of an output timer. This output timer is selected to correspond to the digital processing delay of the system, i.e., the time required for a signal to pass from the variable input gain device 20 to the variable output gain device 28. When a sample magnitude exceeding the upper acceptable limit is first detected, the program in step 114 starts the output time and in step 116 sets the output flag. Once the output flag has been set, the program then in subsequent cycles will branch to step 118 where it is determined if the output timer has expired, and if so, then through steps 120 and 122 where the gain of the variable output device 28 is changed to the calculated new output gain and the output flag is cleared.

In the event that step 106 finds the sample magnitude 42 less than the upper limit 43, the program proceeds to step 130 where it is determined if this sample magnitude is less than the lower limit 48 of the acceptable A-D input signal range 44. When step 130 is true the program branches to step 132 which determines the existence of a low signal flag. When the low signal is initially determined, step 132 is false and the low signal flag is set in step 134 and the low signal timer is started in step 136. The low signal timer has a time period, generally in the range from five to thirty seconds and preferably in the range from thirteen to fifteen seconds, designed to prevent gain changes from normal cyclic low signal values in the digital audio signal and to avoid excessive changes in the gains of the variable input and output devices caused by pauses or quiet periods in program content. Excessive changes tend to introduce distortion and the like into the program signal.

While the low signal flag remains set, the program in subsequent cycles where determined sample magnitudes are found below the acceptable range in step 130 branches from step 132 to step 140 where it is determined if the low signal timer has expired. If true then the program in steps 142, 144 and 146, increases the gain of the variable gain input device 22, calculates a corresponding new output gain and clears the low signal flag. The increase in the input gain is by an increment such as 0.5 dB with a corresponding reduction in the calculated new output gain similar to step 110 described above.

When either step 130 or step 140 is found false, the program proceeds to step 150 where the existence of an output flag is determined. As in step 112, the presence of this output flag indicates the running of the digital processing delay which by the step 118 provides for proper timing of the change in the gain of the variable gain output device 28 to avoid introduction of distortion in the audio signal. However if step 150 is false, the program branches to step 152 where any low signal flag is cleared. The clearing of the low signal flag in step 152 prevents unwanted increases in the gain of the variable gain input device 22 during normal cycles of the audio signal or during short quiet periods or pauses in the audio program.

The automatic control of the input gain in correspondence to changes in magnitude of the input signal prevents distortion of the signal by the digital processing units. Additionally, the dynamic range of audio signal magnitudes which can be properly processed by digital processing can be increased by twelve to fifteen dB. The thirteen to fifteen second delay in increase of input gain in response to a low input signal magnitude has been found in one embodiment to represent an optimum balance between rapid response for dynamic range increase and avoidance of distortion by excessive changes. Changing the input and output gains by small increments, such as ±0.5 dB, avoids introduction of noticeable distortion in the audio signal. While such small changes cannot overcome clipping of sudden large magnitude signals, for example a cymbal clash, distortions by magnitude clipping of such sudden audio magnitude increases are not readily noticeable.

In a modified procedure 100a in FIG. 8, a counter counting successive low signal sample magnitudes is used in place of the low signal timer of FIG. 7 to provide the required time period during which the sample magnitudes 42 must continuously remain below the range of acceptable input signal magnitudes before increasing the input gain in step 142. When the sample magnitude 42 is below the acceptable range and there is an absence of the low signal flag, the program proceeds through steps 106, 130, 132 and 134 to step 136a where a count is set in the low signal counter. This count is selected to correspond to the desired low signal time period. Subsequent sample magnitudes below the range of acceptable input signal magnitudes result in branching form step 132 to step 162 where the low signal counter is decremented. Then in step 140a, it is determined whether the low signal count is zero and if true then proceeds through steps 142, 144, 146, 114 and 116 as in the procedure of FIG. 7. In still further alternatives, the output timer of FIG. 7 can be similarly replaced with a corresponding counter counting a number of samples corresponding to the digital processing delay.

Figure 8:
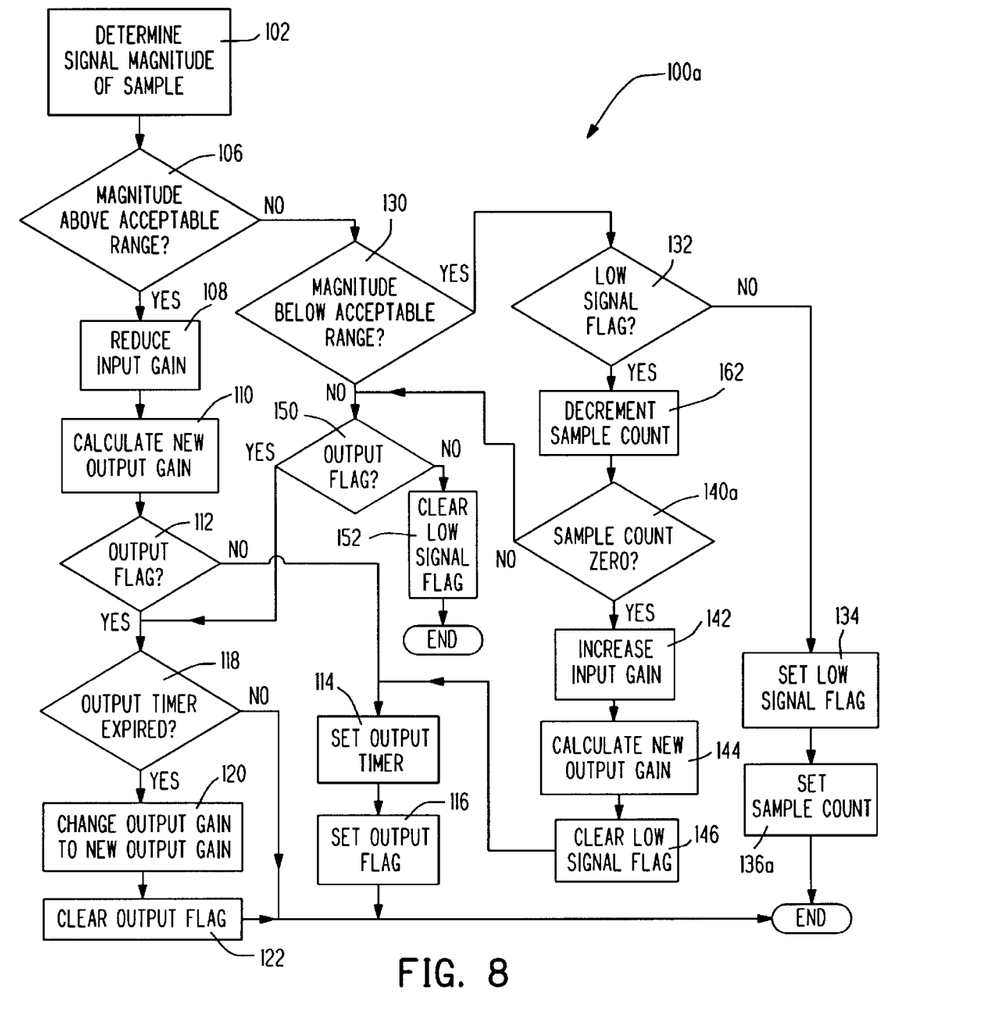
FIG. 8 is a modified flow chart of an automatic gain control procedure suitable for use in the system of FIG. 1.
Figure 9:
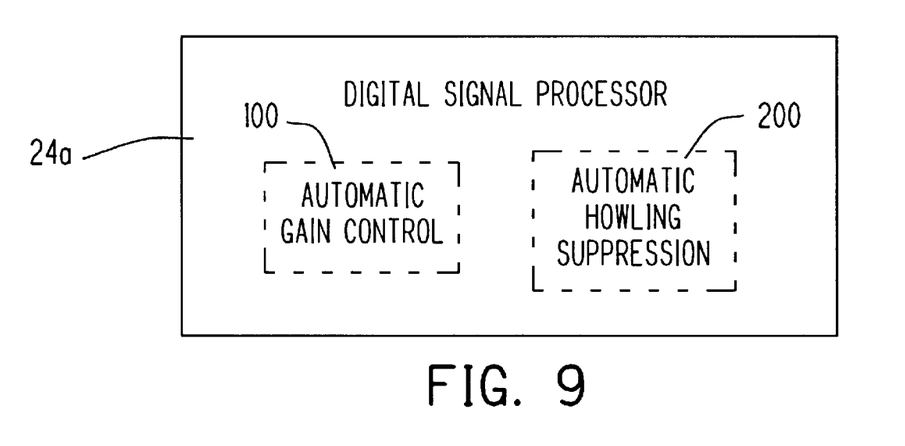
FIG. 9 is block diagram of one digital processing application of the system of FIG. 1.
Figure 10:
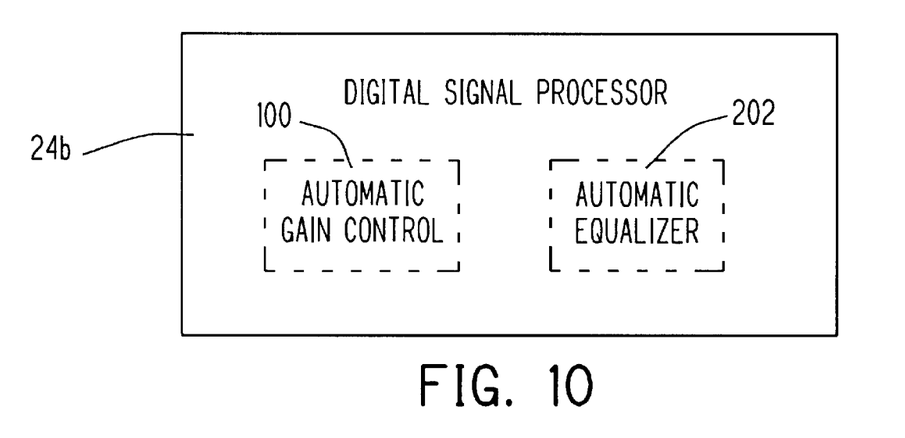
FIG. 10 is block diagram of a second digital processing application of the system of FIG. 1.
Figure 11:
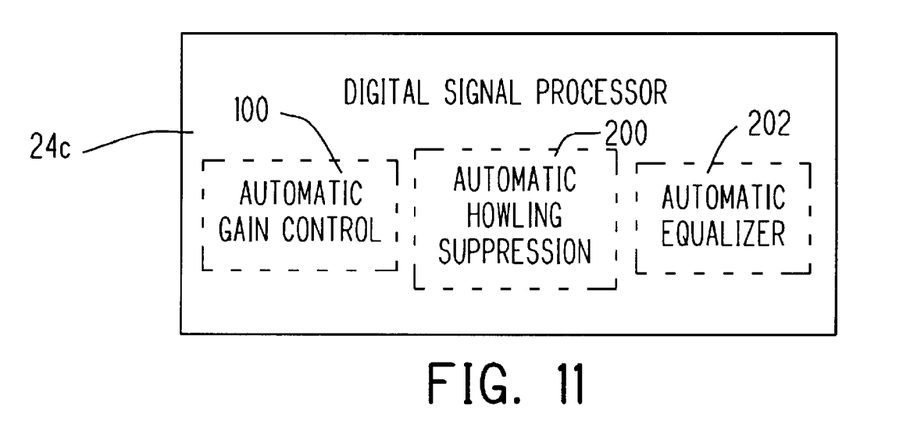
FIG. 11 is block diagram of a third digital processing application of the system of FIG. 1.
Figure 12:
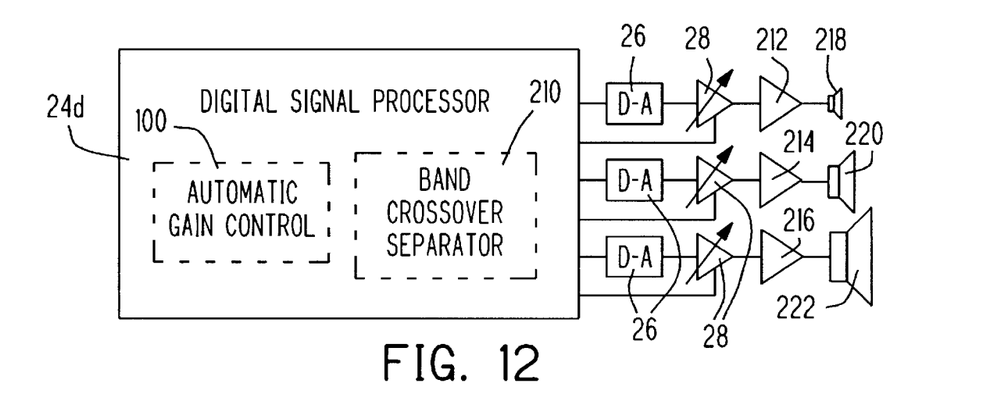
FIG. 12 is block diagram of a fourth digital processing application of the system of FIG. 1.
Figure 13:
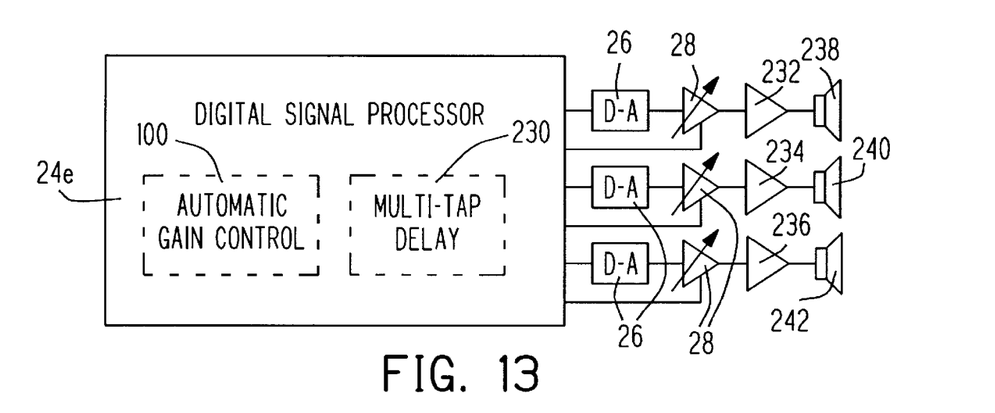
FIG. 13 is block diagram of a fifth digital processing application of the system of FIG. 1.

While the automatic gain control procedures 100 and 100a of FIGS. 7 and 8 set timers and/or counters and then monitors the set timers or counters during subsequent cycles to provide (1) the delay corresponding to the digital processing delay between the variable input and output gain devices 22 and 28 and (2) the much longer delay for increase of gain due to low input signal magnitude, such delays could be performed by setting delay interrupts with interrupt procedures for performing the change in output gain and the increase in input gain.

Variations of the digital signal processor 24 are shown in FIGS. 9, 10, 11, 12 and 13 as digital signal processors 24a, 24b, 24c, 24d and 24e. In the variation 24a of FIG. 9, the digital signal processor includes an automatic howling suppression unit 200 such as described in U.S. Pat. No. 5,245,665 in addition to the automatic gain control 100. In the variation 24b of FIG. 10, the digital signal processor includes an automatic equalizer unit 202 such as described in U.S. Pat. No. 5,506,910 in addition to the automatic gain control 100. The equalizer unit 202 sets the frequency spectrum response to a desired response. In the variation 24c of FIG. 11, the digital signal processor includes both an automatic howling suppression unit 200 and an automatic equalizer unit 202 such as described in the U.S. Pat. No. 5,506,910. In the variation 24d of FIG. 12, the digital signal processor includes a band crossover unit 210 in addition to the automatic gain control 100. The crossover unit 210 has digital filters providing the audio frequency bands such as high, middle and low bands applied by respective D-A converters 26 and variable output gain devices 28 to corresponding power amplifiers such as amplifiers 212, 214 and 216 driving respective band speakers such as high frequency speaker (tweeter) 218, middle frequency speaker 220 and low frequency speaker (woofer) 222. In the variation 24e of FIG. 13, a digital signal processor includes a multi-tap delay unit 230 in addition to the automatic gain control 100. The multi-tap delay unit 230 includes timers or other delay devices for providing signals applied by respective D-A converters 26 and variable output gain devices 28 to respect power amplifiers 232, 234 and 236 driving respective speaker or speaker banks 238, 240 and 242. In auditoriums, stadiums and other places where spaced speakers broadcast to audiences, the multi-tap delay 230 delays the audio signals to selected speakers in correspondence to differences in distances of the speakers from the audience resulting in improved sound quality for the audience. A digital signal processor with the above automatic gain control 100 can include many other signal processing procedures in addition to and/or in place of the above optional digital processing units or procedures.

Many modifications, variations and changes in detail can be made to the above described embodiments without departing from the scope and spirit of the invention which is defined in the following claims.

What is claimed is:

1. An apparatus for automatic clip level adjustment for audio signal processing comprising
    a variable gain input device for controlling magnitude of an analog input signal;
    an analog to digital converter for converting the controlled analog input signal to a digital audio signal;
    means for determining magnitudes of successive samples of the digital audio signal;
    means for comparing each determined sample magnitude to upper and lower limits of an acceptable range of audio input signal magnitude;
    input gain reducing means responsive to the comparing means finding one of the determined sample magnitudes greater than the upper limit of the acceptable audio signal magnitude range for reducing the gain of the variable gain input device;
    input gain increasing means responsive to the comparing means finding a predetermined plurality of successive sample magnitudes of the determined sample magnitudes less than the lower limit of the acceptable audio signal magnitude range for increasing the gain of the variable gain input device;
    the audit input signal being increased by said input gain increasing means at a rate which is less than a rate at which the audio input signal is reduced by said input gain reducing: means;
    digital processing means for processing the digital audio signal;
    a digital to analog converter for converting the processed digital audio signal to an analog output signal;
    a variable gain output device for controlling the magnitude of the analog output signal; and
    output gain control means responsive to the input gain reducing means reducing the gain of the variable gain input device for increasing the gain of the variable gain output device and responsive to the input gain increasing means increasing the gain of the variable gain input device for decreasing the gain of the variable gain output device.

2. An apparatus as claimed in claim 1 wherein the output gain control means includes delay means for delaying the increase and the decrease of the gain of the variable gain output device by a period equal to a digital signal processing delay.

3. An apparatus as claimed in claim 1 wherein the input gain increasing means includes means for requiring a plurality of successive sample magnitudes to remain continuously less than the lower limit of the acceptable audio signal magnitude range for a predetermined time period before increase of the gain of the variable gain input device.

4. An apparatus as claimed in claim 3 wherein the predetermined period is in the range from about five to thirty seconds.

5. An apparatus as claimed in claim 1 wherein the combined gains of the variable gain input device and the variable gain output device remain constant, except during process delay periods for increases and decreases in gain.

6. An apparatus as claimed in claim 5 wherein the combined gains of the variable gain input device and the variable gain output device is equal to one, except during process delay periods for increases and decreases in gain.

7. An apparatus as claimed in claim 1 wherein the digital processing means includes means for suppressing howling.

8. An apparatus as claimed in claim 1 wherein the digital processing means includes equalizer means for setting frequency spectrum response to a desired response.

9. A method of automatic clip level adjustment for audio signal processing comprising the steps of
    converting an analog audio input signal to a digital audio signal;
    determining magnitudes in successive samples of the digital audio signal;
    comparing each determined sample magnitude to upper and lower limits of an acceptable range of audio input signal magnitude;
    reducing the magnitude of the audio input signal when the comparing finds one of the determined sample magnitudes greater than the upper limit of the acceptable audio signal magnitude range;
    increasing the magnitude of the audio input signal when the comparing finds a predetermined plurality of successive sample magnitudes of the determined sample magnitudes less than the lower limit of the acceptable audio signal magnitude ranger;
    said increasing of the magnitude of the audio input signal being at a rate which is less than a rate at which said reducing of the magnitude of the audio input signal is performed;

processing the digital audio signal;

converting the processed digital audio signal to an analog audio output signal;

reducing the magnitude of the audio output signal in response to the increase of the magnitude of the audio input signal; and increasing the magnitude of the audio output signal in response to the decrease of the magnitude of the audio input signal.

10. A method as claimed in claim 9 wherein the increasing and the decreasing of the audio output signal is delayed for a period equal to a digital signal processing delay.

11. A method as claimed in claim 9 wherein the increasing of the magnitude of the audio input signal is performed after a predetermined period during which the comparing finds the plurality of successive determined signal magnitudes less than the lower limit of the acceptable audio signal magnitude range.

12. A method as claimed in claim 11 wherein the predetermined period is in a range from about five to thirty seconds.

13. A method as claimed in claim 9 wherein the reduction of the magnitude of the audio output signal is equal to the increase in the magnitude of the audio input signal, and the increase in the magnitude of the audio output signal is equal to the reduction in the magnitude of the audio input signal.

14. A method as claimed in claim 9 wherein the digital processing includes suppressing howling.

15. A method as claimed in claim 9 wherein the digital processing includes setting frequency spectrum response to a desired response.

* * * * *